(12) United States Patent
Direcks et al.

(10) Patent No.: US 8,421,993 B2
(45) Date of Patent: Apr. 16, 2013

(54) FLUID HANDLING STRUCTURE, LITHOGRAPHIC APPARATUS AND DEVICE MANUFACTURING METHOD

(75) Inventors: Daniel Jozef Maria Direcks, Simpelveld (NL); Danny Maria Hubertus Philips, Son en Breugel (NL); Clemens Johannes Gerardus Van Den Dungen, Eindhoven (NL); Maikel Adrianus Cornelis Schepers, Nuenen (NL); Paul Petrus Joannes Berkvens, Veldhoven (NL); Koen Steffens, Veldhoven (NL); Arnold Jan Van Putten, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 423 days.

(21) Appl. No.: 12/437,433

(22) Filed: May 7, 2009

(65) Prior Publication Data

US 2009/0279062 A1   Nov. 12, 2009

Related U.S. Application Data

(60) Provisional application No. 61/071,621, filed on May 8, 2008, provisional application No. 61/129,717, filed on Jul. 14, 2008, provisional application No. 61/071,620, filed on May 8, 2008, provisional application No. 61/071,876, filed on May 22, 2008.

(51) Int. Cl.
*G03B 27/52* (2006.01)

(52) U.S. Cl.
USPC ................. 355/30; 355/67; 355/72

(58) Field of Classification Search ................ 355/30, 355/67, 72
See application file for complete search history.

(56) References Cited

U.S. PATENT DOCUMENTS

| 4,509,852 | A | 4/1985 | Tabarelli et al. |
| 6,988,326 | B2 * | 1/2006 | O'Donnell et al. ............ 34/381 |
| 7,292,313 | B2 | 11/2007 | Poon et al. |
| 7,423,720 | B2 | 9/2008 | Verspay et al. |
| 7,443,482 | B2 | 10/2008 | Novak et al. |
| 7,520,285 | B2 * | 4/2009 | Garcia ......................... 134/98.1 |

(Continued)

FOREIGN PATENT DOCUMENTS

| EP | 1420298 A2 | 5/2004 |
| EP | 1420300 A2 | 5/2004 |

(Continued)

OTHER PUBLICATIONS

Japanese Office Action mailed Sep. 5, 2011 in corresponding Japanese Patent Application No. 2009-113348.

(Continued)

*Primary Examiner* — Thomas R Artman
(74) *Attorney, Agent, or Firm* — Pillsbury Winthrop Shaw Pittman LLP

(57) ABSTRACT

A fluid handling structure is disclosed in which the size and arrangement of the fluid extraction openings is specified in order to reduce the vibrations which are transmitted to the fluid handling structure as a result of two-phase extraction. The area of each fluid extraction opening and/or the total area of all of the fluid extraction openings and/or the space in between neighboring fluid extraction openings may be controlled. The reduction in vibrations increases the accuracy of the exposure.

20 Claims, 10 Drawing Sheets

U.S. PATENT DOCUMENTS

| | | | |
|---|---|---|---|
| 7,561,248 B2 | 7/2009 | Nakano | |
| 7,632,376 B1* | 12/2009 | Ravkin et al. | 156/345.1 |
| 7,710,537 B2 | 5/2010 | Verspay et al. | |
| 7,839,483 B2 | 11/2010 | Leenders et al. | |
| 7,924,416 B2 | 4/2011 | Hikima | |
| 7,932,989 B2 | 4/2011 | Novak et al. | |
| 2004/0136494 A1 | 7/2004 | Lof et al. | |
| 2004/0207824 A1 | 10/2004 | Lof et al. | |
| 2005/0213066 A1 | 9/2005 | Sumiyoshi | |
| 2006/0023183 A1 | 2/2006 | Novak et al. | |
| 2006/0038968 A1* | 2/2006 | Kemper et al. | 355/18 |
| 2006/0103821 A1 | 5/2006 | Verspay et al. | |
| 2006/0119809 A1 | 6/2006 | Verhagen et al. | |
| 2006/0164616 A1 | 7/2006 | Okada | |
| 2006/0187427 A1 | 8/2006 | Stavenga et al. | |
| 2006/0291060 A1 | 12/2006 | Shirai et al. | |
| 2007/0030464 A1 | 2/2007 | Kemper et al. | |
| 2007/0081140 A1 | 4/2007 | Beckers et al. | |
| 2007/0097341 A1 | 5/2007 | Hikima | |
| 2007/0146666 A1 | 6/2007 | Leenders et al. | |
| 2007/0247600 A1 | 10/2007 | Kobayashi et al. | |
| 2007/0268466 A1 | 11/2007 | Leenders et al. | |
| 2008/0007704 A1 | 1/2008 | Leenders et al. | |
| 2008/0212046 A1 | 9/2008 | Riepen et al. | |
| 2008/0266533 A1 | 10/2008 | Nagasaka et al. | |
| 2009/0279060 A1* | 11/2009 | Direcks et al. | 355/30 |
| 2009/0296053 A1 | 12/2009 | Poon et al. | |
| 2009/0296065 A1* | 12/2009 | Cloin et al. | 355/71 |
| 2010/0195067 A1 | 8/2010 | Nagasaka et al. | |
| 2011/0134400 A1 | 6/2011 | Shibazaki | |
| 2011/0199593 A1* | 8/2011 | Riepen et al. | 355/30 |
| 2011/0199601 A1* | 8/2011 | Kaneko et al. | 355/72 |

FOREIGN PATENT DOCUMENTS

| | | |
|---|---|---|
| EP | 1 571 698 | 7/2005 |
| EP | 1 677 156 | 5/2006 |
| JP | 2004-259966 | 9/2004 |
| JP | 2005-191344 | 7/2005 |
| JP | 2006-060223 | 3/2006 |
| JP | 2006-140494 | 6/2006 |
| JP | 2006-523029 | 10/2006 |
| JP | 2007-504662 | 3/2007 |
| JP | 2007-142460 | 6/2007 |
| JP | 2007-194613 | 8/2007 |
| JP | 2007-318117 | 12/2007 |
| KR | 1020060093676 | 8/2006 |
| KR | 1020080017299 | 2/2008 |
| WO | 99/49504 A1 | 9/1999 |
| WO | 2005/029559 | 3/2005 |
| WO | 2005/064405 A2 | 7/2005 |
| WO | 2005/081290 | 9/2005 |
| WO | 2006/101120 | 9/2006 |

OTHER PUBLICATIONS

Japanese Office Action mailed Aug. 1, 2011 in corresponding Japanese Patent Application No. 2009-112566.
Japanese Office Action mailed Aug. 1, 2011 in Japanese Patent Application No. 2009-112621.
Korean Office Action dated Feb. 14, 2011 in Korean Patent Application No. 10-2009-0040484.
European Search Report dated Oct. 11, 2010 in European patent application No. 09159532.2-1226.
Singapore Written Opinion and Search Report dated Aug. 1, 2012 in corresponding Singapore Patent Application No. 201103843-7.
Chinese Office Action dated Oct. 25, 2012 in corresponding Chinese Patent Application No, 200910140581.8.
Japanese Office Action mailed Nov. 8, 2012 in corresponding Japanese Patent Application No. 2009-113348.
US 7,821,615, 10/2010, Novak et al. (withdrawn)

* cited by examiner

FLUID HANDLING STRUCTURE, LITHOGRAPHIC APPARATUS AND DEVICE MANUFACTURING METHOD

This application claims priority and benefit under 35 U.S.C. §119(e) to U.S. Provisional Patent Application No. 61/071,621, entitled "Fluid Handling Structure, Lithographic Apparatus and Device Manufacturing Method", filed on May 8, 2008, to U.S. Provisional Patent Application No. 61/129,717, entitled "Fluid Handling Structure, Lithographic Apparatus and Device Manufacturing Method", filed on Jul. 14, 2008, and to U.S. Provisional Patent Application No. 61/071,620, entitled "Immersion Lithographic Apparatus, Drying Device, Immersion Metrology Apparatus and Device Manufacturing Method", filed on May 8, 2008, and to U.S. Provisional Patent Application No. 61/071,876, entitled "Immersion Lithographic Apparatus, Drying Device, Immersion Metrology Apparatus and Device Manufacturing Method", filed on May 22, 2008. The content of each of the foregoing applications is incorporated herein in its entirety by reference.

FIELD

The present invention relates to a fluid handling structure, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although other liquids can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desired. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, such as an aromatic and/or a fluorohydrocarbon, and an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion liquid is handled by a fluid handling system or apparatus. In an embodiment the fluid handling system may supply immersion fluid and therefore be a fluid supply system. In an embodiment the fluid handling system may confine fluid and thereby be a fluid confinement system. In an embodiment the fluid handling system may provide a barrier to fluid and thereby be a barrier member. In an embodiment the fluid handling system may create or use a flow of fluid (such as gas), for example to help in handling liquid. In an embodiment, immersion liquid may be used as the immersion fluid. In that case, the fluid handling system may be a liquid handling system.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, preferably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via an inlet and is taken up on the other side of the element by an outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

FIG. 4 schematically depicts an exemplary liquid supply system for use in a lithographic projection apparatus, according to an embodiment of the present invention. A liquid is supplied by two groove inlets on either side of the projection system PL and is removed by a plurality of discrete outlets, arranged radially outwardly of the inlets. In the embodiment of FIG. 4, inlets and outlets are arranged within a plate having a hole through which a beam of radiation is projected. Liquid is supplied by one groove inlet on one side of the projection system PL and is removed by a plurality of discrete outlets on the other side of the projection system PL, thereby causing a flow of a thin film of liquid between the projection system PL and the projection system PL. The choice of a combination of inlet and outlets incorporated within the liquid supply system can depend on the direction of movement of the substrate W (the other combination of inlet and outlets being inactive). Arrows in liquid supply and liquid recovery devices indicate the direction of liquid flow.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication no. WO 2005/064405 discloses an all wet arrangement in which the immersion liquid is unconfined. In such a system substantially the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system may improve temperature control and processing of the substrate, evaporation of the immersion liquid can still occur. One way of alleviating that problem is described in United States patent application publication no. US 2006/119809 in which a member is provided which covers the substrate W in all positions and which is arranged to have immersion liquid extending between it and the top surface of the substrate and/or substrate table which holds the substrate.

SUMMARY

In immersion lithographic systems such as those described above, disturbances such as vibrations may occur in the immersion system, for example through operation of the immersion system. The disturbances may be transmitted through the immersion liquid, including the liquid through which the radiation beam is projected. Such disturbances can have a detrimental effect on the accuracy of the exposure, for example affecting accuracy and stability of positioning thus causing an error in positioning, affecting focusing or both.

Therefore, it is desirable, for example, to provide a fluid handling system in which the disturbance forces in the immersion liquid are reduced, or substantially eliminated.

According to an aspect, there is provided a fluid handling structure for a lithographic apparatus, the fluid handling structure comprising a surface in which a plurality of fluid extraction openings are defined, wherein the fluid extraction openings:

are directed, in use, towards a facing surface, the facing surface comprising a surface of a substrate and/or a substrate table configured to support a substrate, are configured to define, in use, a meniscus of an immersion liquid in an immersion space, by removing a mixture of (i) immersion liquid from the immersion space and (ii) gas from an atmosphere outside the immersion liquid, the meniscus defined between the facing surface and the surface in which the openings are defined, and each have an area less than or equal to 0.1 mm$^2$.

According to an aspect, there is provided a fluid handling structure for a lithographic apparatus, the fluid handling structure comprising a surface in which a plurality of fluid extraction openings are defined, wherein the fluid extraction openings:

are directed, in use, towards a facing surface, the facing surface comprising a surface of a substrate and/or a substrate table configured to support a substrate, are configured to define, in use, a meniscus of an immersion liquid in an immersion space, by removing a mixture of (i) immersion liquid from the immersion space and (ii) gas from an atmosphere outside the immersion liquid, the meniscus defined between the facing surface and the surface in which the openings are defined, and each have a maximum dimension less than or equal to 0.4 mm.

According to an aspect, there is provided a fluid handling structure for a lithographic apparatus, the fluid handling structure comprising a surface in which a plurality of fluid extraction openings are defined, wherein the fluid extraction openings:

are directed, in use, towards a facing surface, the facing surface comprising a surface of a substrate and/or a substrate table configured to support a substrate, are configured to define, in use, a meniscus of an immersion liquid in an immersion space, by removing a mixture of (i) immersion liquid from the immersion space and (ii) gas from an atmosphere outside the immersion liquid, the meniscus defined between the facing surface and the surface in which the openings are defined, and have an area of fluid extraction openings provided per meter of a linear arrangement defined by the fluid extraction openings selected from the range of 25 mm$^2$m$^{-1}$ to 100 mm$^2$m$^{-1}$.

According to an aspect, there is provided a fluid handling structure for a lithographic apparatus, the fluid handling structure comprising a surface in which a plurality of fluid extraction openings are defined, wherein the fluid extraction openings are:

are directed, in use, towards a facing surface, the facing surface comprising a surface of a substrate and/or a substrate table configured to support a substrate, are configured to define, in use, a meniscus of an immersion liquid in an immersion space, by removing a mixture of (i) immersion liquid from the immersion space and (ii) gas from an atmosphere outside the immersion liquid, the meniscus defined between the facing surface and the surface in which the openings are defined, and have a combined total area of less than or equal to 30 mm$^2$.

According to an aspect of the invention, there is provided an immersion lithographic apparatus comprising:

a projection system having an optical axis;

a substrate table configured to support a substrate, the substrate, substrate table, or both, defining a facing surface; and a fluid handling structure comprising a surface in which a plurality of fluid extraction openings are defined, the fluid handling structure configured to supply and confine immersion liquid to a space defined between the projection system and the facing surface, wherein the fluid extraction openings:

are directed, in use, towards the facing surface;

are configured to define, in use, a meniscus of an immersion liquid in the space by removing a mixture of (i) immersion liquid from the immersion space and (ii) gas from an atmosphere outside the immersion liquid, the meniscus defined between the facing surface and the surface in which the openings are defined; and have one or more of the following features:

the area of each fluid extraction opening is less than or equal to 0.1 mm²;

the maximum dimension of each fluid extraction opening is less than or equal to 0.4 mm;

the combined total area of all of the fluid extraction openings is less than or equal to 30 mm²; or the area of fluid extraction openings provided per meter of the edge meniscus that they define is selected from the range of 25 mm²m⁻¹ to 100 mm²m⁻¹.

According to an aspect of the invention, there is provided a device manufacturing method comprising:

providing an immersion liquid to an immersion space defined between a projection system and a substrate table; and retrieving immersion liquid from the immersion space by applying an under pressure to a plurality of fluid extraction openings in a fluid handling structure, each of the fluid extraction openings having an area that is less than or equal to 0.1 mm².

According to an aspect of the invention, there is provided a fluid handling structure for a lithographic apparatus, the fluid handling structure comprising a surface in which a plurality of fluid extraction openings are defined, wherein the fluid extraction openings:

are directed, in use, towards a facing surface, the facing surface comprising a surface of a substrate and/or a substrate table configured to support a substrate, are configured to define, in use, a meniscus of an immersion liquid in an immersion space, by removing a mixture of (i) immersion liquid from the immersion space and (ii) a gas from an atmosphere outside the immersion liquid, the meniscus defined between the facing surface and the surface in which the openings are defined, and for a given total area of all of the fluid extraction openings, have an area of each fluid extraction opening set so that a disturbance force is reduced.

In an embodiment, the total perimeter of the shape defined by the plurality of fluid extraction openings is selected from the range of 150 mm to 400 mm. In an embodiment, the shape of each opening is one of: a rectangle; a square; or a circle.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
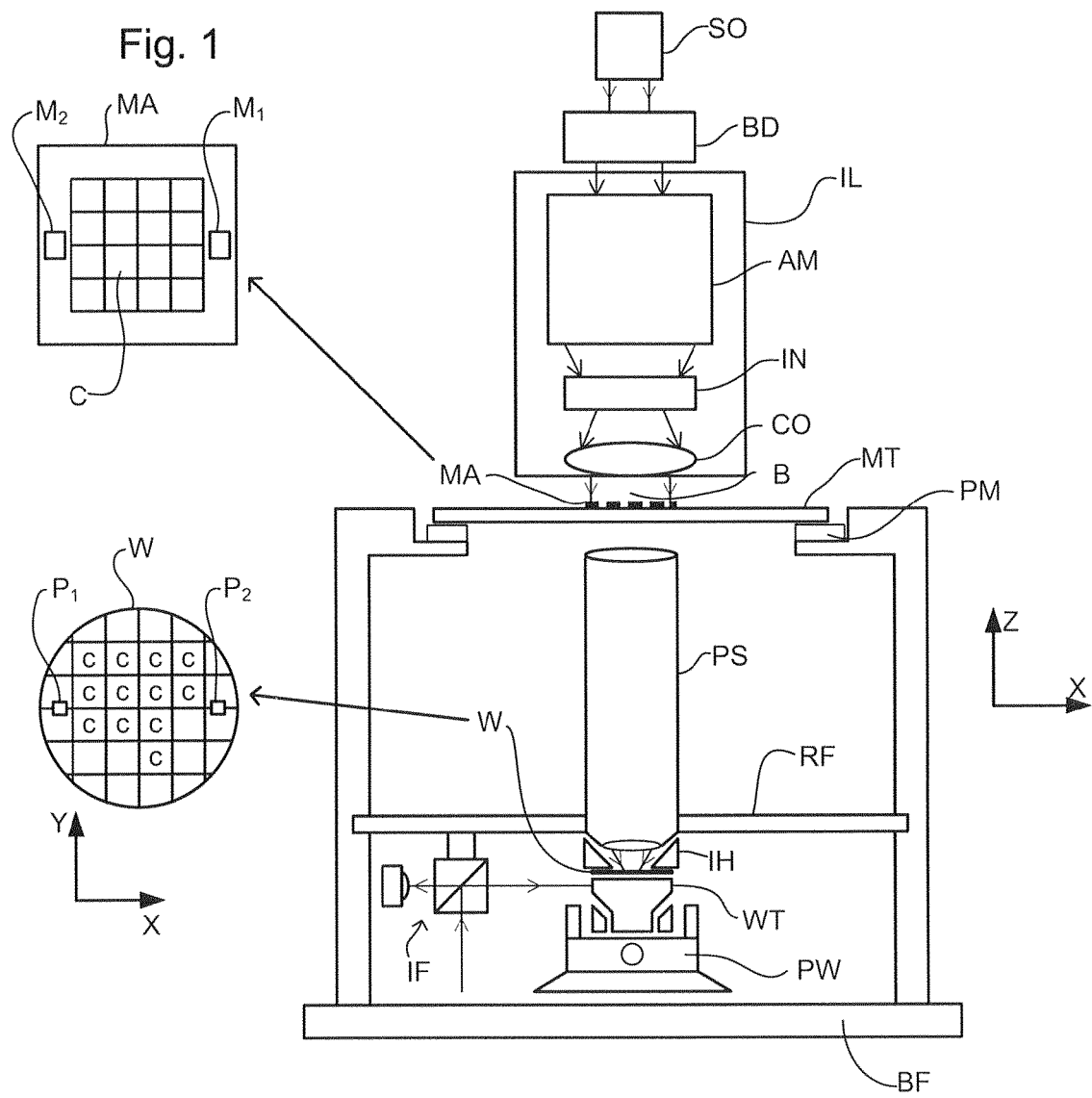
FIG. 1 depicts a lithographic apparatus according to an embodiment of the invention.
Figure 2:
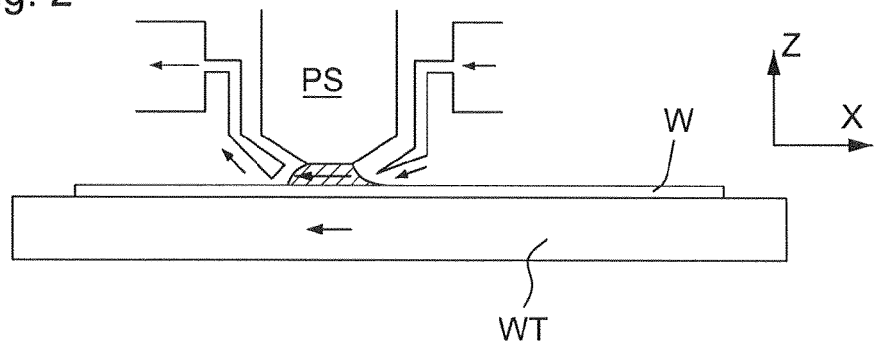
FIGS. 2 and 3 depict a liquid supply system for use in a lithographic projection apparatus.
Figure 3:
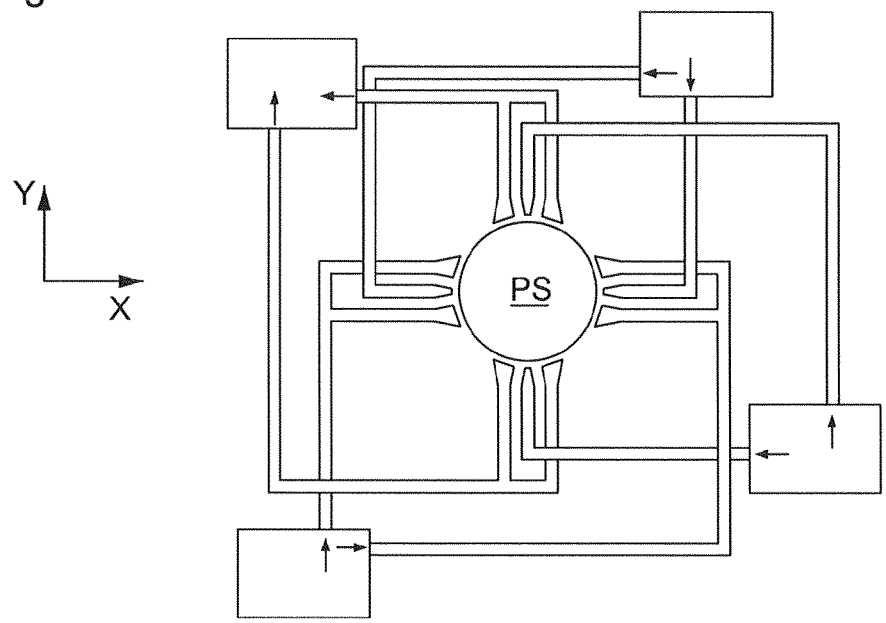
Figure 4:
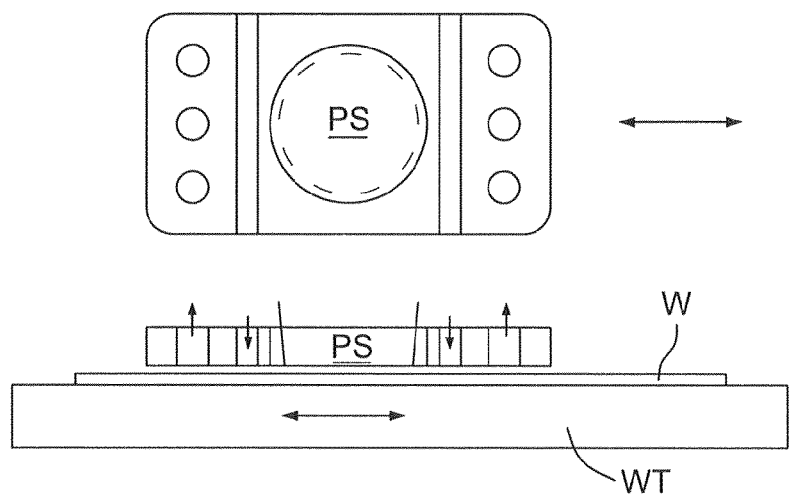
FIG. 4 depicts a liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are a bath type arrangement, a so called localized immersion system and an all wet arrangement. In the bath type arrangement substantially the whole of the substrate W and optionally part of the substrate table WT is submersed in a bath of liquid.

In the so called localized immersion system a liquid supply system is used in which liquid is only provided to a localized area of the substrate. The space filled by liquid is smaller in plan than the top surface of the substrate. The area filled with liquid remains substantially stationary relative to the projection system PS while the substrate W moves underneath that area.

In the all wet arrangement the liquid is unconfined. Substantially the whole top surface of the substrate and all or part of the substrate table is covered in immersion liquid. The depth of the liquid covering at least the substrate is small. The liquid may be a film, such as a thin film, of liquid on the wafer. Any of the liquid supply devices of FIGS. 2-5 can also be used in such a system. However, sealing features are not present, are not activated, are not as efficient as normal or are otherwise ineffective to seal liquid to only the localized area.

Figure 5:
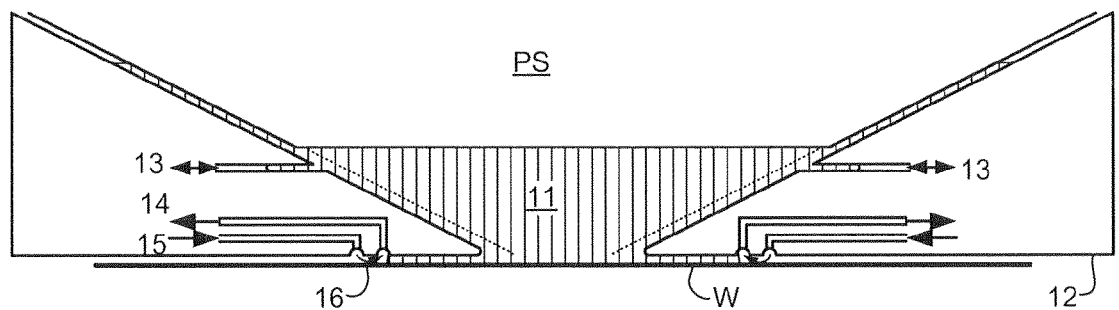
FIG. 5 depicts a liquid confinement structure for use in a lithographic projection apparatus.

Four different types of localized liquid supply systems are illustrated in FIGS. 2-5. The liquid supply systems disclosed in FIGS. 2-4 were described above. Another arrangement which has been proposed is to provide the liquid supply system with a barrier member which extends along at least a part of a boundary of the space between the final element of the projection system and the substrate table. Such an arrangement is illustrated in FIG. 5.

FIG. 5 schematically depicts a localized liquid supply system or fluid handling structure with a barrier member having a body 12. The body 12 extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid handling structure is substantially stationary relative to the projection system in the XY plane though there may be some relative movement in the Z direction (in the direction of the optical axis). In an embodiment, a seal is formed between the body 12 and the surface of the substrate W and may be a contactless seal such as a fluid seal, each a gas seal or a capillary force seal.

The body 12 at least partly contains liquid in the space 11 between a final element of the projection system PL and the substrate W. A contactless seal 16 to the substrate W may be formed around the image field of the projection system so that liquid is confined within the space between the substrate W surface and the final element of the projection system PL. The space is at least partly formed by the body 12 positioned below and surrounding the final element of the projection system PL. Liquid is brought into the space below the projection system and within the body 12 through the opening 13 for liquid. The liquid may be removed through an opening 13. The body 12 may extend a little above the final element of the projection system. The liquid level rises above the final element so that a buffer of liquid is provided. In an embodiment, the body 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid is contained in the space 11 by a gas seal 16 which, during use, is formed between the bottom of the body 12 and the surface of the substrate W. The gas seal is formed by gas, e.g. air or synthetic air but, in an embodiment, $N_2$ or another inert gas. The gas in the gas seal is provided under pressure via an opening 15 for inlet of gas to the gap between barrier member 12 and substrate W. The gas is extracted via an opening 14 for outlet of the gas. The overpressure on the opening 15 for gas inlet, vacuum level on the opening 14 for gas outlet and geometry of the gap are arranged so that there is a high-velocity gas flow 16 inwardly that confines the liquid. The force of the gas on the liquid between the body 12 and the substrate W contains the liquid in a space 11. The openings for outlet and inlet of gas may be annular grooves which surround the space 11. The annular grooves may be continuous or discontinuous. The flow of gas 16 is effective to contain the liquid in the space 11. Such a system is disclosed in United States patent application publication no. US 2004-0207824.

An embodiment of the present invention relates to a particular type of extractor for use in a fluid handling structure which aims to prevent the meniscus from advancing beyond a certain point. That is, an embodiment of the invention relates to a meniscus pinning device which pins a liquid meniscus in place. The meniscus may be the edge of liquid in a space between the final element of the projection system and a facing surface such as the substrate and/or substrate table. The meniscus pinning arrangement relies on a so-called gas drag extractor principle which has been described, for example, in U.S. patent application no. U.S. Ser. No. 11/987,569, filed Nov. 30, 2007. In that system, extraction holes are placed in a cornered shape. The corners are aligned with the stepping and scanning directions. This reduces the force on the meniscus between two outlet openings for a given speed in the step or scan direction compared to if the two outlet openings were aligned perpendicular to the direction of step or scan. In embodiments of the present invention, the openings need not be arranged in a cornered shape, however.

Figure 6:
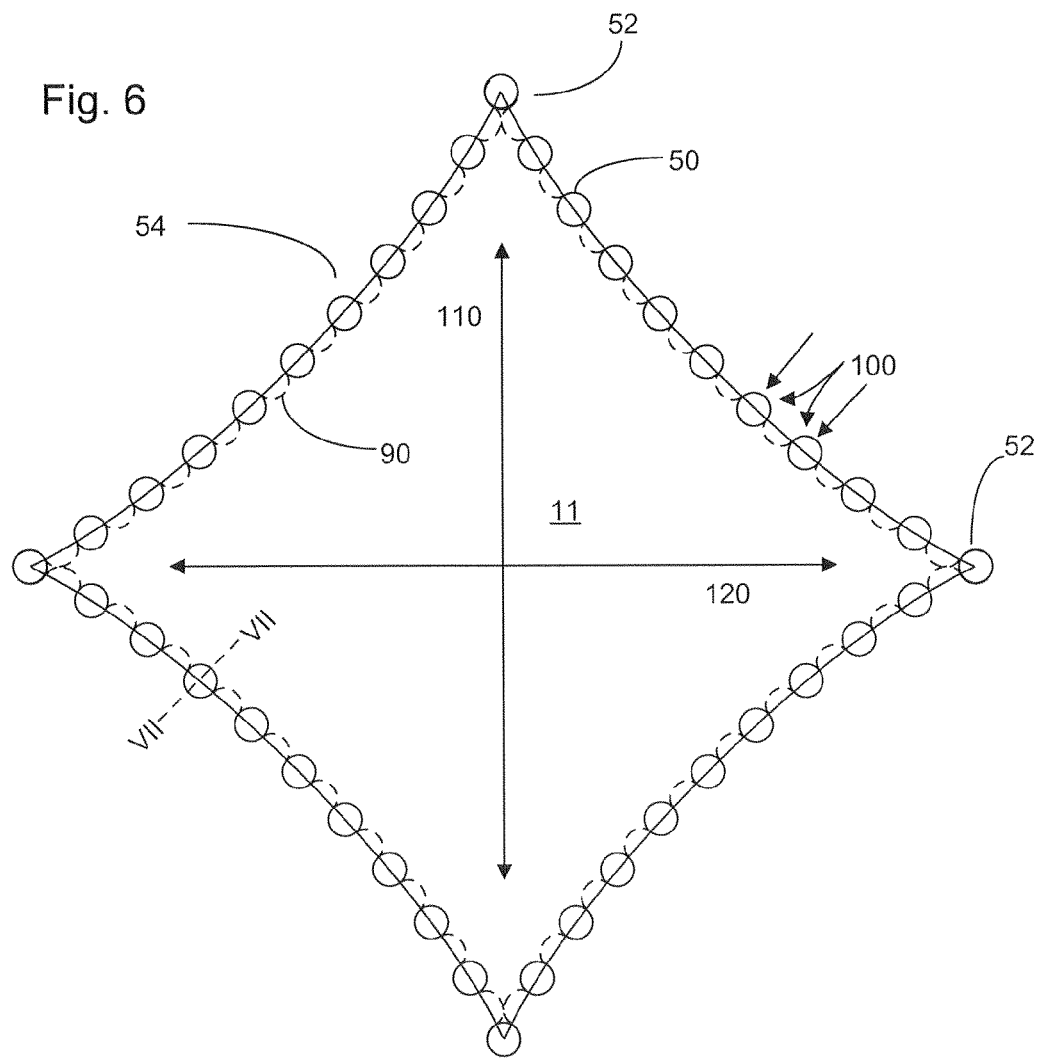
FIG. 6 is a schematic illustration, in plan, of a meniscus pinning system according to an embodiment of the present invention.

FIG. 6 illustrates schematically and in plan the meniscus pinning feature of a fluid handling structure or system of an embodiment of the present invention. The features of a meniscus pinning device are illustrated which may, for example, replace or augment the meniscus pinning arrangement 14, 15, 16 of FIG. 5. The meniscus pinning device of FIG. 6 comprises a plurality of discrete openings 50. Each opening 50 is illustrated as being circular though this is not necessarily the case. Each opening 50 may be one of the shapes selected from the following shapes: circular, square, rectangular, oblong, triangular, elongate slit, etc. In a plurality of openings, the openings may have similar shapes or at least one of the openings may have a shape different from the other shapes.

Each of the openings 50 of the meniscus pinning device of FIG. 6 may be connected to a separate under pressure source. Alternatively or additionally, each or a plurality of the openings 50 may be connected to a common chamber (which may be annular) which is itself held at an under pressure. In this way a uniform under pressure at each or a plurality of the openings 50 may be achieved. The openings 50 can be connected to a vacuum source and/or the atmosphere surrounding the fluid handling structure or system (or confinement structure, barrier member, body or liquid supply system) may be increased in pressure to generate the desired pressure difference.

In the embodiment of FIG. 6 the openings are fluid extraction openings. That is they are inlets for the passage of gas, liquid or both into the fluid handling structure. That is, the inlets may be considered as outlets from the space 11. This will be described in more detail below.

The openings 50 are formed in a surface of a fluid handling structure 12. That surface faces the substrate W and/or substrate table WT, in use. In an embodiment the openings 50 are in a flat surface of the fluid handling structure 12. In an embodiment, a ridge may be present on the bottom surface of the substrate member. In that embodiment the openings may be in the ridge. In an embodiment, the openings 50 may be defined by needles. The bodies of some of the needles, e.g., adjacent needles, may be joined together. The needles may be joined together to form a single body. The single body may form a corner shape.

Figure 7:
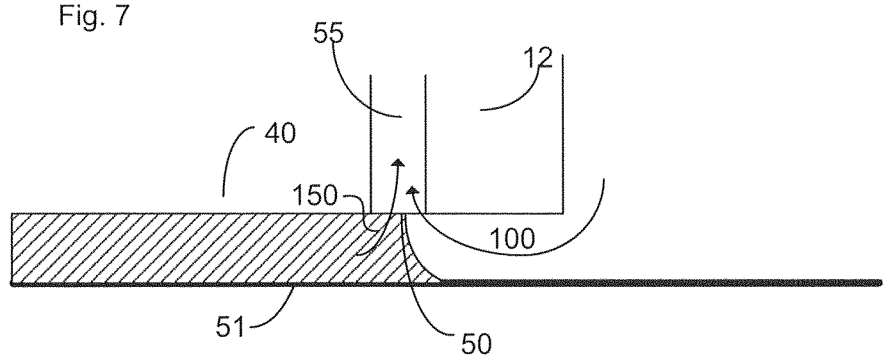
FIG. 7 depicts, in cross-section in a plane substantially parallel to the optical axis of the projection system, a meniscus pinning system according to an embodiment of the present invention.

As can be seen from FIG. 7, the openings 50 may be the end of a tube or elongate passageway 55, for example. Desirably the openings 50 are positioned such that they face the substrate W in use. The rims (i.e. outlets out of a surface) of the openings 50 are substantially parallel to a top surface of the substrate W. The openings 50 are directed, in use, towards the substrate W and/or substrate table WT configured to support the substrate. Another way of thinking of this is that an elongate axis of the passageway 55 to which the opening 50 is connected is substantially perpendicularly (within +/−45°, desirably within 35°, 25° or even 15° from perpendicular) to the top surface of the substrate W.

Each opening 50 is designed to extract a mixture of liquid and gas. The liquid is extracted from the space 11 whereas the gas is extracted from the atmosphere on the other side of the openings 50 to the liquid. The extraction creates a gas flow as illustrated by arrows 100. This gas flow is effective to pin the meniscus 90 between the openings 50 substantially in place as illustrated in FIG. 6. The gas flow helps maintain the liquid confined by momentum blocking, by a gas flow induced pressure gradient and/or by drag (shear) of the gas flow on the liquid.

The openings 50 surround the space 11 to which the fluid handling structure 12 supplies liquid. That is, the openings 50 are substantially continuously spaced around the space (although, as will be described below, the spacing between adjacent openings 50 may vary). In an embodiment of the present invention liquid is extracted all the way around the immersion space 11 defined by the openings 50, for example through each of the openings 50 simultaneously. This is achieved because the openings 50 may be distributed around the space (in, for example, a closed shape such as a cornered shape) for example so as to surround the space 11. The edge of the shape, such as a cornered shape may form a line. The distribution of the openings 50 along the line may form a linear array of openings.

In an immersion lithographic apparatus which uses a fluid handling structure comprising openings 50, such as that described above in relation to FIGS. 6 and 7, force disturbances and/or vibrations may be generated. These force disturbances may have a detrimental effect on the accuracy and/or repeatability of the exposure of a substrate W for example by affecting positioning and/or focus. The disturbance force and/or vibration is generated by, for example, the two-phase extraction flow extracted through the fluid extraction openings 50.

There appears to be two main sources of disturbance forces that result from the two-phase fluid extraction. The first source of disturbance (hereinafter referred to as the upstream source) is the disturbance force generated by the two-phase fluid extraction flow at the openings 50 themselves. This may be caused by the two-phase flow through the openings 50. The second source of disturbance (hereinafter referred to as the downstream source) is the disturbance force generated downstream of the openings 50 in the fluid handling structure. For example, such a downstream source of disturbance could be generated by the two-phase flow in a duct through which the two-phase fluid is subsequently transported. Alternatively or additionally, the downstream disturbance force may be generated by a suction device (such as a pump) that is used to generate the under-pressure at the openings 50, or in a separation tank which is used to separate the two phases in the two phase fluid flow, or both.

The disturbance force (or vibration) created by the two different sources explained above can reduce the accuracy of the exposure of a substrate W. For example, the disturbance force can cause part of the immersion lithographic apparatus (such as the substrate W and/or substrate table WT, and/or a part of the projection system PS) to move in an uncontrolled manner, for example due to vibration. This can reduce the accuracy of the position of the substrate relative to the exposing radiation. As a result, the accuracy of the exposure of the substrate W may be reduced.

The accuracy of the exposure of a substrate W may be additionally or alternatively reduced by the force disturbance resulting in a focusing error. For example, once the substrate has been positioned (which, as noted above, may not be in the desired place) the vibration may cause the substrate to move (e.g. vibrate, shake or oscillate) during exposure. In turn, this may have a negative impact on the accuracy of the exposure of the substrate W.

The presence of such a disturbance force therefore presents a serious obstacle to the effectiveness of a so-called meniscus pinning fluid handling structure such as described above in relation to FIGS. 6 and 7. A great deal of effort and expenditure has therefore been spent in trying to overcome a problem presented by this disturbance force.

Particular arrangements and/or geometries of the fluid extraction openings 50 are described. These arrangements and/or geometries have been found to address the problem of unwanted disturbance force generated by the two-phase extraction flow. The particular arrangements and/or geometries of the fluid extraction openings 50 proposed give a number of unexpected advantages to the fluid handling structure, as explained below.

Figure 10:
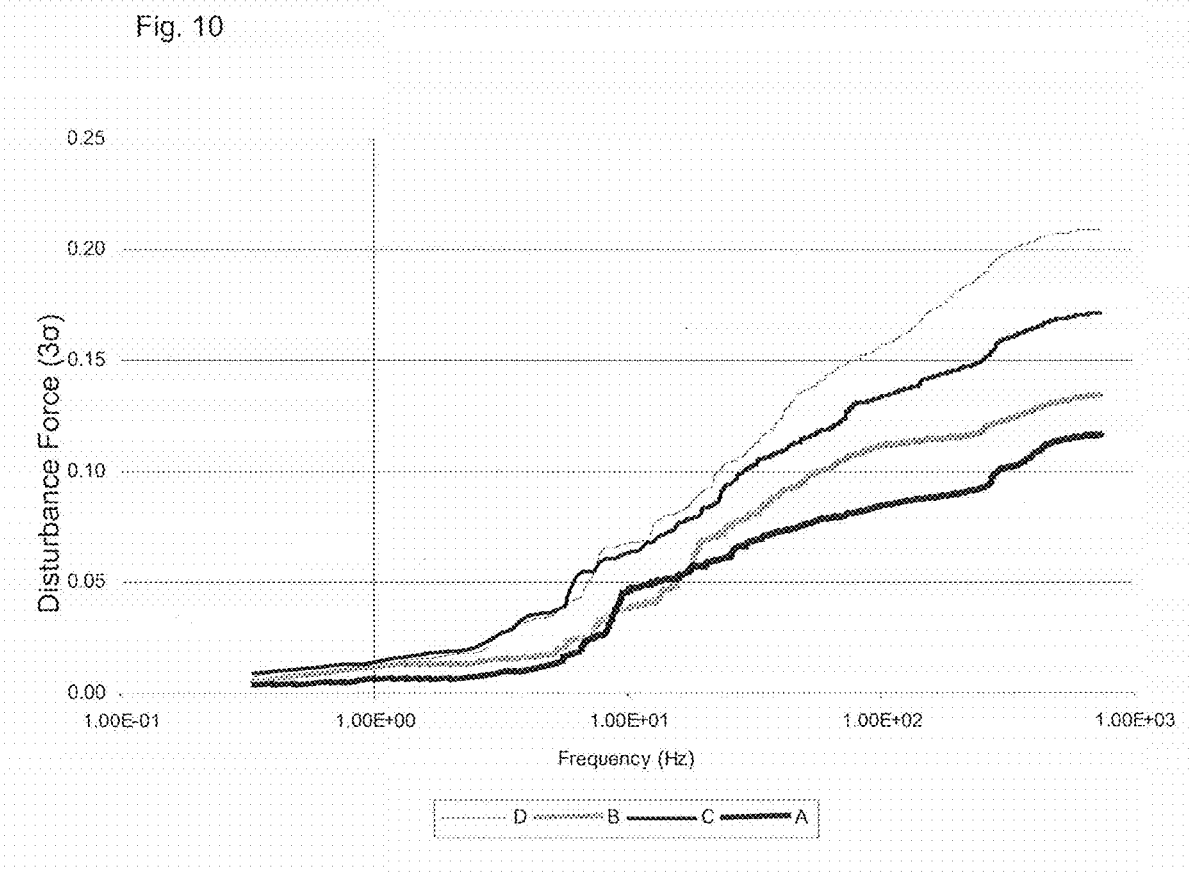
FIG. 10 is a graph showing disturbance force measured in the immersion system, for example on a confinement structure, versus frequency for various arrangements and geometries of fluid extraction openings according to embodiments of the present invention.

FIG. 10 shows a graph of frequency (x-axis, logarithmic scale) against 3σ force (y-axis, linear scale) for various different sizes and arrangements of the extraction openings 50. The graph shown in FIG. 10 is generated using experimentally measured data. The 3σ (force represents a cumulative disturbance force measured over the given frequencies.

The geometry and arrangement of openings 50 used to generate the four different curves A, B, C, D is as follows:
  Curve A: 288 openings; each opening 0.2 mm×0.2 mm;
  Curve B: 184 openings; each opening 0.25 mm×0.25 mm;
  Curve C: 288 openings; each opening 0.25 mm×0.25 mm;
  Curve D: 112 openings; each opening 0.5 mm×0.5 mm.

The shape of each of the openings 50 used to generate curves A-D was square in each case. However, this is required to be the case. Openings of different shapes (such as circular, rectangular or triangular) may be used instead of the square openings, as explained below in relation to FIGS. 8 and 9. Advantages explained herein relating to the area and spacing of each and/or all of the openings 50 apply to openings of any different shape, including all of those listed above.

One parameter that has been found to have a surprisingly great effect on the disturbance force is the area of each of the fluid extraction openings 50. Comparisons of curves A and B in FIG. 10 illustrates this point.

As stated above, curve A is generated using fluid extraction openings with dimensions 0.2 mm by 0.2 mm. Thus, each fluid extraction opening 50 has an area of 0.04 mm$^2$. Because there are a total of 288 openings, the total area of all of the fluid extraction openings 50 is 11.52 mm$^2$. In comparison, curve B is generated using fluid extraction openings with dimensions 0.25 mm×0.25 mm. Thus, each fluid extraction opening 50 used to generate curve B has an area of 0.0625 mm². Because curve B was generated using geometry with 184 openings, the total area of all of the fluid extraction openings 50 in this case is 11.5 mm², i.e. virtually the same as the total area of all the fluid extraction openings 50 used in the geometry to create curve A (in fact within 0.2% of the total area). All other material parameters in the geometry of the fluid handling structure 12 used to generate curves A and B are identical. As such, any difference in the measured disturbance force between the geometry of curves A and B may be attributed to the difference in the area of each individual opening 50.

As can be seen in FIG. 10, the disturbance force measured, for example at the substrate W or on the liquid confinement structure, is significantly less for the geometry used to generate curve A than the geometry used to generate curve B. Thus, FIG. 10 shows that for a given total area of extraction openings, the disturbance force is reduced as the size (e.g. area) of each fluid extraction opening 50 is decreased.

If each individual fluid extraction opening 50 has an area that is too small, then the fluid extraction may become ineffective. This may be because the fluid extraction may become inefficient. This may be due to increased losses occurring through very small holes. In addition, manufacturing holes below a certain size may present significant manufacturing difficulties. Holes below a certain size may not be desirable because of the difficulty involved in cleaning them.

In an embodiment, the area of each individual fluid extraction opening may be less than or equal to 0.1 mm². In an embodiment, the area of each individual fluid extraction opening may be selected from the range of 0.01 mm² to 0.1 mm². This range gives a surprising advantage of reducing disturbance force relating to having holes below a certain size. The range also results in the efficient extraction associated with the area of the openings not being below a certain value. In an embodiment, the area of each of the fluid extraction openings 50 is selected from the range of 0.02 mm² to 0.09 mm². In an embodiment, the area of each of the fluid extraction openings 50 is selected from the range of 0.03 mm² to 0.08 mm². In an embodiment, the area of each of the fluid extraction openings 50 is selected from the range of 0.04 mm² to 0.07 mm². In an embodiment, the area of each fluid extraction opening 50 is approximately 0.05 mm². In an embodiment, the area of each fluid extraction opening 50 is approximately 0.06 mm².

Figure 8:
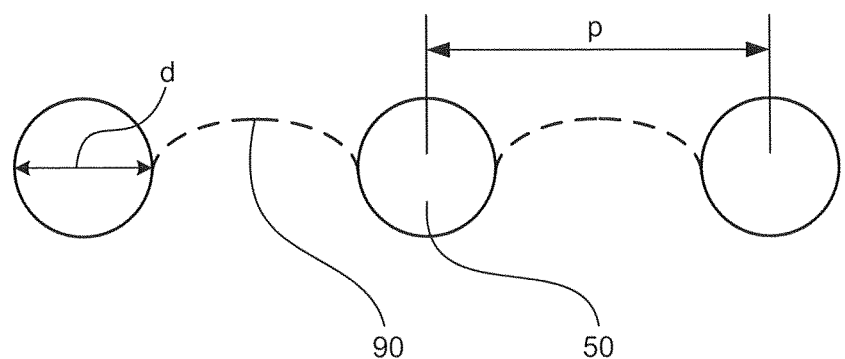
FIG. 8 depicts, in plan, three neighboring fluid extraction openings of the meniscus pinning system shown in FIG. 6 according to an embodiment of the present invention.

As mentioned above, advantages associated with use of the described range of cross-sectional areas for each fluid extraction opening 50 applies to openings 50 having any shape (for example any 2-D shape). For example, each fluid extraction opening 50 could have a circular cross section, as shown in FIG. 8. In FIG. 8, the diameter of each fluid extraction opening 50 is labeled d. In an embodiment, the value of d may be less than or equal to 0.4 mm. In an embodiment, the value of d may be selected from the range of 0.1 mm to 0.4 mm. In an embodiment, the value of d may be selected from the range of 0.2 mm to 0.3 mm. In an embodiment, the diameter d of each circular opening 50 shown in FIG. 8 is 0.25 mm.

Figure 9:
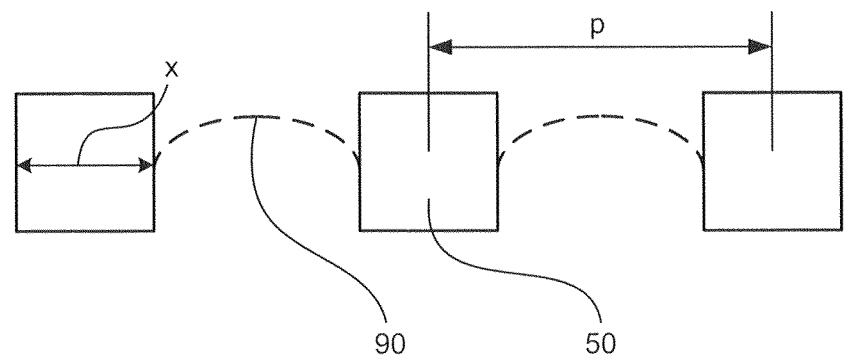
FIG. 9 illustrates, in plan, three fluid extraction openings of the meniscus pinning system shown in FIG. 6 according to an embodiment of the present invention.

In an embodiment, each opening 50 may be a square. Such an embodiment is shown in FIG. 9. In FIG. 9, the length of each of the sides of the square openings 50 is given as x. In an embodiment, the length x of each side of the square openings 50 may be less than or equal to 0.4 mm. In an embodiment, the length x of each side of the square openings 50 may be selected from the range of 0.1 mm to 0.4 mm. In an embodiment, the length x of each side of the square openings 50 may be selected from the range of 0.2 mm to 0.3 mm. In an embodiment, the length x of each side of the square openings 50 is 0.25 mm.

In an embodiment having different fluid extraction opening shapes, the values given for the distance x above may represent the length of the longest side (or maximum dimension) of the shape. In an embodiment, the largest cross sectional dimension of an opening may be selected from the range of 0.1 mm to 0.6 mm. In an embodiment, the largest cross sectional dimension may be selected from the range of 0.2 mm to 0.5 mm.

The force disturbance reduction advantage shown by an embodiment of the present invention may be provided by having a maximum distance between each opening 50 (i.e. a maximum pitch or spacing) for a given number of fluid extraction openings 50, or given length of a linear arrangement of fluid extraction openings. In FIG. 8, the maximum distance between each opening 50 (i.e. a maximum pitch or spacing) is labeled p. In an embodiment, the pitch for any geometry and/or dimension of opening 50 described herein is selected from the range of 0.4 mm to 2 mm. In an embodiment, the pitch for any geometry and/or dimension of opening 50 described herein is selected from the range of 0.5 mm to 1.5 mm. In an embodiment, the pitch for any geometry and/or dimension of opening 50 described herein is selected from the range of 0.7 mm to 1 mm. In other words, the number of fluid extraction openings 50 per meter may be an important parameter. In an embodiment, the number of fluid extraction openings 50 per meter is selected from the range of 500 m$^{-1}$ to 2500 m$^{-1}$. In an embodiment, the number of fluid extraction openings 50 per meter is in the range of from 1000 m$^{-1}$ to 2000 m$^{-1}$. In an embodiment, the number of fluid extraction openings 50 per meter is approximately 1500 m$^{-1}$.

A parameter that has been found to have an unexpectedly important effect on the disturbance forces measured at the substrate W is the total area of all of the fluid extraction openings 50. Curves C and B in FIG. 10 illustrate this point. Curve C is generated using 288 square fluid extraction openings 50, each having dimensions 0.25 mm×0.25 mm. Thus, the total area of all of the fluid extraction openings 50 used to generate the curve C is 18 mm². Curve B was generated using 184 square fluid extraction openings 50, each having the same dimensions as those used to generate curve C, i.e. 0.25 mm×0.25 mm. Thus, the total area of all of the fluid extraction openings 50 used to generate curve B is 11.5 mm². All other material parameters of the geometry of the fluid handling structure 12 used to generate curves B and C are identical.

FIG. 10 shows that the reduction in total area in all of the fluid extraction openings 50 from 18 mm² to 11.5 mm² from curves C to B results in a significant reduction in the disturbance force transmitted to the substrate W. Thus, a reduction in total area of the fluid extraction openings 50 may result in a reduction in the disturbance forces transmitted to the substrate W.

However, the total area of the fluid extraction openings 50 desirably should not be reduced below a certain minimum value. This is because when the total area is below a certain value, the fluid extraction may become ineffective. This may be due to inefficiencies in the fluid extraction. For example, it may be due to excessive losses generated by extracting the fluid through a very small area.

In an embodiment, the combined total area of all of the fluid extraction openings 50 may be less than or equal to 30 mm², desirably less than 20 mm². In an embodiment, the combined total area of all of the fluid extraction openings 50 is selected from the range of 2 mm² to 30 mm². In an embodiment, the combined total area of all of the fluid extraction openings 50 is selected from the range of 2 mm² to 20 mm². In an embodiment, the combined total area of all of the fluid extraction openings 50 is selected from the range of 5 mm² to 18 mm². In an embodiment, the combined total area of all of the fluid extraction openings 50 is selected from the range of 7 mm² to 15 mm². In an embodiment, the combined total area of all of the fluid extraction openings 50 is selected from the range of 9 mm² to 13 mm². In an embodiment, the combined total area of all of the fluid extraction openings 50 is approximately 11.5 mm².

According to an embodiment, advantages may be provided by having a number of openings 50 that are of a certain size (e.g. area), with the absolute number of openings being in a certain range and/or below a certain value.

As explained above, the area of each fluid extraction opening 50 and the total area of all of the fluid extraction openings 50 have an unexpectedly important effect on the disturbance force at the substrate W. (Please note that reference herein to disturbance force applied to the substrate W also includes reference to disturbance force applied to the substrate table WT or both the substrate table WT and the substrate W, unless stated otherwise to the contrary). The area of each fluid extraction opening 50 and the total area of all of the fluid extraction openings 50 may have an important effect on the disturbance force provided at the substrate W independently of each other, as discussed above. However, curves A, B and C in FIG. 10 show that the two effects can work together.

In particular, the reduction in disturbance force shown in the geometry of curve C to the geometry of curve B may be explained as being a result of the reduction in total area of all of the fluid extraction openings 50. This is because, as explained above, the individual openings used to generate curves B and C are identical, but because there are fewer openings 50 in the geometry used to generate curve B than that used to generate curve C (184 openings versus 288 openings), the total area of all of the fluid extraction openings is reduced from curve C to curve B. The reduction in total area is from 18 mm² to 11.5 mm².

A very similar reduction in total area of all of the fluid extraction openings 50 is applied in the change in geometry used to create curve A compared with that used to create curve C. In this case, the actual reduction is from 18 mm² for curve C to 11.52 mm² for curve A. However, as shown in FIG. 10, the reduction in disturbance force in the immersion system, for example at the substrate W or on the liquid confinement structure 12, is much greater between curve C and curve A than between curve C and curve B. This may be because, in addition to having the same total area reduction applied to the geometry of curve B, curve A also has a reduction in the area of each individual fluid extraction opening 50 from 0.0625 mm² to 0.04 mm². The compound effect of reducing both (i) the total area of all of the fluid extraction openings 50; and (ii) the area of each individual fluid extraction opening 50 means that the reduction in disturbance force from curve C to curve A is greater than the reduction in disturbance force from curve C to curve B.

The total extraction area of the openings 50 per meter may have a significant impact on the disturbance force transmitted to the substrate W. In an embodiment, the total extraction area of the openings 50 per meter is selected from the range of 25 mm²m⁻¹ to 100 mm²m⁻¹. In an embodiment, the total extraction area of the openings 50 per meter is selected from the range of the range of 40 mm²m⁻¹ to 90 mm²m⁻¹, desirably the range of 50 mm²m⁻¹ to 85 mm²m⁻¹, desirably the range of 60 mm²m⁻¹ to 80 mm²m⁻¹, or desirably the range of 65 mm²m⁻¹ to 75 mm²m⁻¹.

FIG. 10 shows that the geometry and/or arrangement of the openings 50 in the fluid handling structure used to generate curves A, B and C produce a significant reduction in disturbance force applied to the substrate W compared with the geometry and/or arrangement of the fluid extraction openings 50 used to generate the curve D. Having regard to the explanation above, this is to be expected because the geometry used to generate curve D had the greatest total area (28 mm²) of all of the fluid extraction openings 50, and also the greatest area for each individual fluid extraction opening 50 (0.25 mm²). In other words, the geometry used to generate curve D is more similar to the geometry of a conventional fluid handling system of this type.

The different arrangements of fluid extraction openings described with reference to curves A, B and C have the openings arranged in linear arrays of openings which have different dimensions in size of opening and opening pitch. In an embodiment the number of openings per unit length of the array may be different. Thus the different arrangements of openings considered have a total area which is defined over the same length of array, for example around the immersion space 11. Therefore the total area of the fluid extraction openings may be expressed as an extraction opening area density over a unit of length. The opening area density thus may depend on the parameters of opening pitch between adjacent openings, the cross-sectional area of each opening, and/or the number of openings per unit length.

In generic terminology, an advantage may be achieved by an array of extraction openings 50 which have an area density within a certain range. The array of openings may each be defined by parameters of, for example, opening cross-sectional area, pitch and number of openings in the array. Each parameter may be within a certain range.

There is a reduction in disturbance force transmitted to the substrate W when using the arrangement and geometry of fluid extraction openings 50 described above. It is thought that a reason for the reduction may be an increase in fluid flow velocity through each fluid extraction opening 50. The increase in velocity may be due to a decrease in area. This may be the decrease in total area of all of the openings 50. Additionally or alternatively, it may be a decrease in area of each of the individual openings 50. The velocity of the two-phase flow as a whole may increase. The velocity of the liquid phase of the two-phase flow may increase. The velocity of the gas in the two-phase flow may increase. It is thought that the proportional increase in flow velocity of the gas phase of the two-phase flow is greater than the proportional increase in the velocity of the liquid phase of the two-phase flow.

The increase in velocity of the fluid through the openings 50, it is thought, may act to damp out, or block, the disturbance force (such as vibration) in the fluid. This results in a decrease in disturbance force experienced by the substrate W.

As explained above, the particular geometry and/or arrangement of the fluid extraction openings 50 proposed has been found to have a surprisingly great effect on the disturbance force. In particular, this has been found to be the case when the total area of the openings 50 and/or the area of each individual opening 50 is reduced below a certain level. This is because, unexpectedly, both the upstream source of disturbance force and the downstream source of disturbance force are reduced for the geometry and/or arrangement of openings described above.

The geometry and/or arrangement of fluid extraction openings 50 described herein results in the generation of a more stable meniscus 90 than is the case for a conventional geometry and arrangement of fluid extraction openings 50. An advantage of this is that the gap between the substrate W and the fluid handling structure 12 may be reduced. An additional or alternative benefit is that the scan-speed (i.e. the relative speed of the substrate W and the projection system PS during exposure) can be increased without droplets and/or bubbles forming. A droplet may form by escaping from the meniscus 90 defined by the openings 50. (Please note that reference herein to a droplet on a surface may refer to a film of liquid). A bubble may form in the immersion space 11 for example by contact between a droplet present on the substrate and/or substrate table contacting, e.g. colliding with the meniscus 90. Such droplets and/or bubbles may have an adverse effect on the exposure, such as becoming a source of defectivity. For example, a bubble may affect, e.g. attenuate, the properties of an exposing radiation beam if it passes through them, and so may create a defective feature. A droplet on the substrate may cause staining, rendering at least that part of the substrate unusable i.e. defective, or become a source of defectively for example contamination. A substrate with a high incidence of defectivity may be rejected.

A further or alternative benefit of providing fluid extraction openings 50 having the geometry and/or arrangement described herein is that the generation of low volume, or fine, droplets of immersion liquid which may be gas borne (which is hereinafter referred to as mist) around the fluid extraction openings 50 may be reduced. Conventionally, such mist presents a significant limitation to fluid handling structures of this type. Mist may pose a risk of damage to the lithographic apparatus, for example if it escapes out of the immersion system. Components outside the immersion system may not be adapted to operate in an environment with an atmosphere comprising mist. Such components may fail in such an environment. Mist may contact and collect (e.g. may fall onto or land) on the substrate W. The mist may form a droplet on the surface of the substrate leading to the defectivity problems mentioned herein, for example the formation of drying stains.

It is thought that this reduction in the production of mist may be a result of more stable two-phase flow being produced in the fluid extraction openings with the geometry and/or arrangement described herein. In particular, it is thought that the two-phase through such openings may exhibit better separation of the gas and liquid phases.

As explained above in relation to FIGS. 6-9 and FIGS. 11-13, the geometry and/or arrangement of the fluid extraction openings 50 may be applied to a variety of plan-shapes of fluid extraction openings 50 (or plan-shapes of meniscus 90 pinned by the openings 50). The geometry and/or arrangement of the fluid extraction openings 50 may be applied to any suitable plan-form arrangement of the fluid extraction openings 50. The plan-form arrangements are not limited to those described in relation to FIGS. 6-9 and FIGS. 11-13.

In an embodiment, the total perimeter of the shape defined by the plurality of fluid extraction openings is selected from the range of 150 mm to 400 mm. In an embodiment, the total perimeter of the shape defined by the plurality of fluid extraction openings is selected from the range of 200 mm to 300 mm.

In an embodiment, such as that of FIG. 6, the openings 50 are positioned so as to form, in plan, a cornered shape (i.e. a shape with corners 52). In the case of FIG. 6 this is in the shape of a square with curved edges or sides 54. The edges 54 have a negative radius of curvature. That is, they curve towards the center of the cornered shape in areas away from the corners 52.

The square has principal axes 110, 120 aligned with the major directions of travel of the substrate W under the projection system. This helps ensure that the maximum scan speed is faster than if the openings 50 were arranged in a circular shape. This is because the force on the meniscus between two openings 50 is reduced with a factor cos θ. Here θ is the angle of the line connecting the two openings 50 relative to the direction in which the substrate W is moving.

Therefore the use of a square shape allows movement in the step and scanning directions to be at an equal maximum speed. If movement in one of the directions, for example the scan direction is desired to be faster than movement in the step direction then a rhombus shape could be used. In such an arrangement the primary axis of the rhombus may be aligned with the scan direction. For a rhombic shape, although each of the corners may be acute, the angle between two adjacent sides of the rhombus, for example in the stepping direction, may be obtuse, i.e. more than 90° (for example selected from the range of about 90° to 120°, in an embodiment selected from the range of 90° to 105°, or in an embodiment selected from the range of 85° to 105°).

Throughput can be optimized by making the primary axis of the shape of the openings 50 aligned with the major direction of travel of the substrate (usually the scan direction) and to have a second axis aligned with the other major direction of travel of the substrate (usually the step direction). It will be appreciated that any arrangement in which θ is different to 90° will give an advantage. Thus, exact alignment of the principal axes with the major directions of travel is not vital. It will further be appreciated that if the shape is circular, then there will always be two openings which are aligned perpendicularly to the direction of travel so that the meniscus between those two openings receives the maximum available force by movement of the substrate W. Nevertheless, an advantage relating to reduction in disturbance force for the geometry and/or arrangement of fluid extraction openings 50 discussed above apply to all plan-form arrangements. Thus, embodiments of the present invention may include any plan-form arrangements, including circular, and oval plan-form arrangements of openings.

An advantage of providing the edges with a negative radius is that the corners may be made sharper. An angle selected from the range of 75 to 85° or even lower may be achievable for both the corners 52 aligned with the scan direction and the corners 52 aligned with the step direction. If it were not for this feature then in order for the corners 52 aligned in both directions to have the same angle, those corners would have to be 90°. If less than 90° were desired it would be necessary to select one direction to have corners with less than 90° with the result that the other corner would have an angle of greater than 90°. It is also possible to have the openings in a star shape in which instead of providing curved edges the edges are straight but meet at a point which lies radial inwardly of a straight line between two corners (see FIGS. 12 and 13). In the star shape embodiment, the corner along the side of the shape will pin the meniscus. For a sharp corner the forces pinning the meniscus are focused on the corner, i.e. a short length of the edge of the shape. A more smoothly curved corner, for example, one with a large radius of curvature, distributes the pinning forces along a longer length of the curve of a corner i.e. around the corner. Thus, for a certain relative velocity between the substrate and the fluid handling structure, the effective meniscus pinning force applied to both corners is the same. However, for a defined length of the edge, the effective pinning force for the sharp corner is more than for the smoothly curved corner. This makes the meniscus pinned at a sharp corner unstable at a lower relative velocity between the substrate and the fluid handling structure than a meniscus pinned by the smoothly curved corner.

FIG. 7 illustrates that the opening 50 is provided in a surface 51 of the bottom 40 of the fluid handling structure. This is however not necessarily the case and the openings 50 may be in a protrusion from the bottom surface of the fluid handling structure. Arrow 100 shows the flow of gas from outside of the fluid handling structure into the passageway 55 associated with the opening 50 and the arrow 150 illustrates the passage of liquid from the space into the opening 50. The passageway 55 and opening 50 are desirably designed so that two phase extraction (i.e. gas and liquid) desirably occurs in an annular flow mode in which gas substantially flows through the center of the passageway 55 and liquid substantially flows along the walls of the passageway 55. This results in smooth flow with low generation of pulsations.

In an embodiment there is no meniscus pinning features radially inwardly of the openings 50. In an embodiment there are no other components or meniscus pinning features radially outwardly of the openings 50. Thus, in comparison to the liquid confinement system of FIG. 5, in this embodiment there is no gas inlet opening 15 or equivalent and the outlet opening 14 has been split into several discrete openings 50 each connected to, e.g., an under pressure source. The meniscus is pinned between the openings 50 with drag forces induced by gas flow into the openings 50. A gas drag velocity of greater than about 15 m/s, desirably 20 m/s is sufficient. By avoiding the need for a gas knife, the amount of evaporation of liquid from the substrate may be reduced thereby reducing both splashing of liquid as well as thermal expansion/contraction effects.

However, embodiments of the present invention are not limited to the structure illustrated. Meniscus pinning features could be present radially inwardly and/or radially outwardly of the openings 50. In an embodiment there is a gas knife provided radially outward of the openings 50. In an embodiment the gas flow provided by the gas knife is balanced. A balanced gas flow means that the gas flow supplied through the opening of the gas knife is substantially removed through the openings 50. In this way gas flows radially inward. There is no gas flow radially outward. Such an arrangement helps minimize the disturbance created by the operation of some designs of gas knife. See U.S. patent application publication no. US 2007-0030464, which is hereby incorporated by reference.

Other geometries of the bottom of the fluid handling structure are possible. For example, any of the structures disclosed in U.S. patent application publication no. US 2004-0207824 could be used in an embodiment of the present invention.

Figure 11:
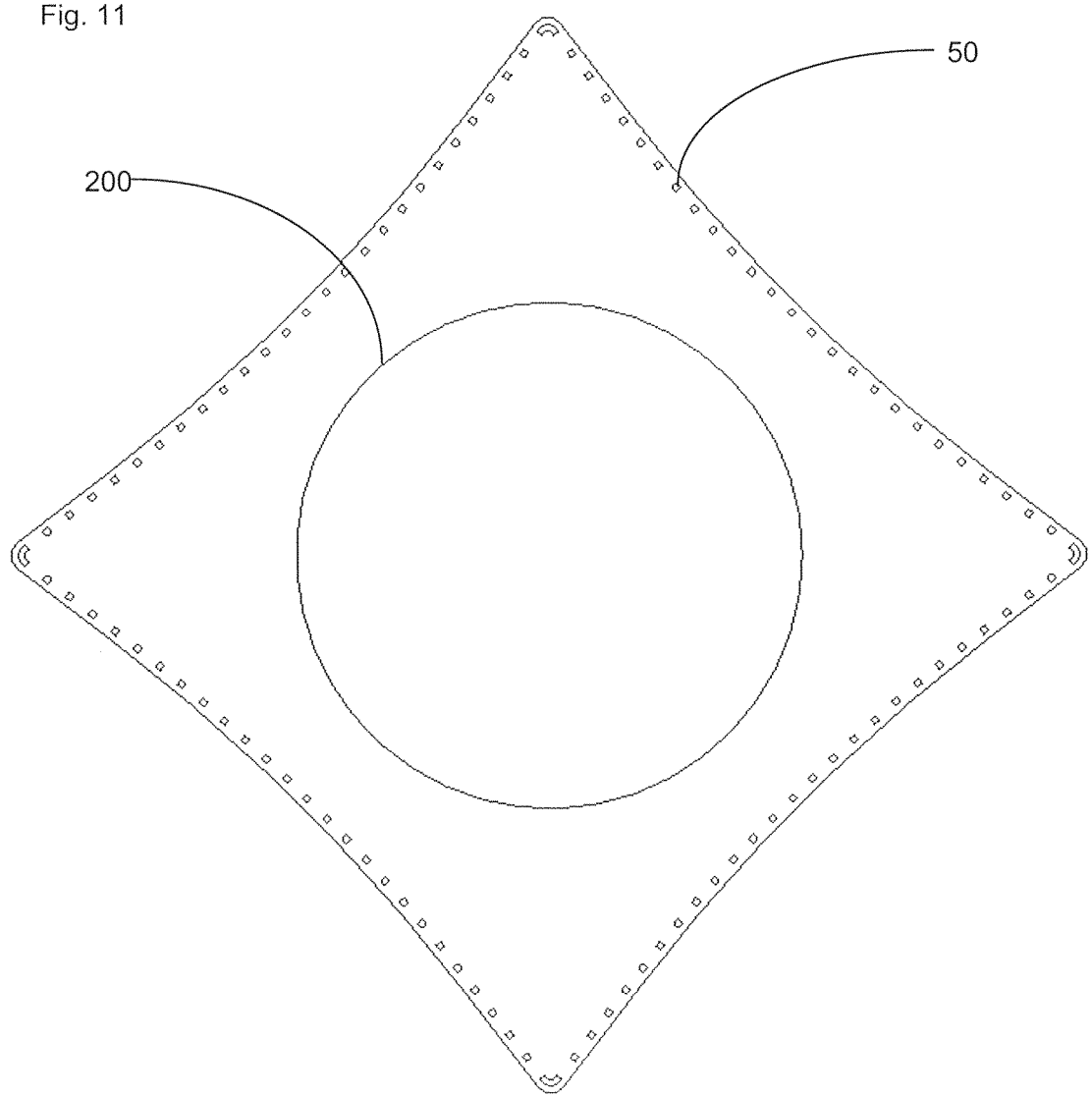
FIG. 11 illustrates, in plan, a practical embodiment of a fluid handling structure according to an embodiment of the present invention.

FIG. 11 illustrates, in plan, a practical embodiment of the present invention. In FIG. 11, the openings 50 are provided in a similar cornered shape to that of FIG. 6. As with the embodiment of FIG. 6, there is an opening present at the apex of each corner in the embodiment of FIG. 11.

In an embodiment, the cornered shape of the openings has four corners and four sides, each side having a negative radius of curvature. However, it may be appropriate to have other cornered shapes. For example, an eight sided shape may have an advantage, for example to improve scan speed with limited layout space. A non-cornered shape may be used instead.

In FIG. 11 a central opening 200 is illustrated. This central opening 200 defines the immersion space 11. In the FIG. 11 embodiment, the central opening is circular, in plan. However, another shape may be used, for example a shape which is the same as the shape of the openings 50 (or in the later described embodiments, the same as the shape of the further openings 105). Other shapes may also be suitable. This applies to all embodiments.

Figure 12:
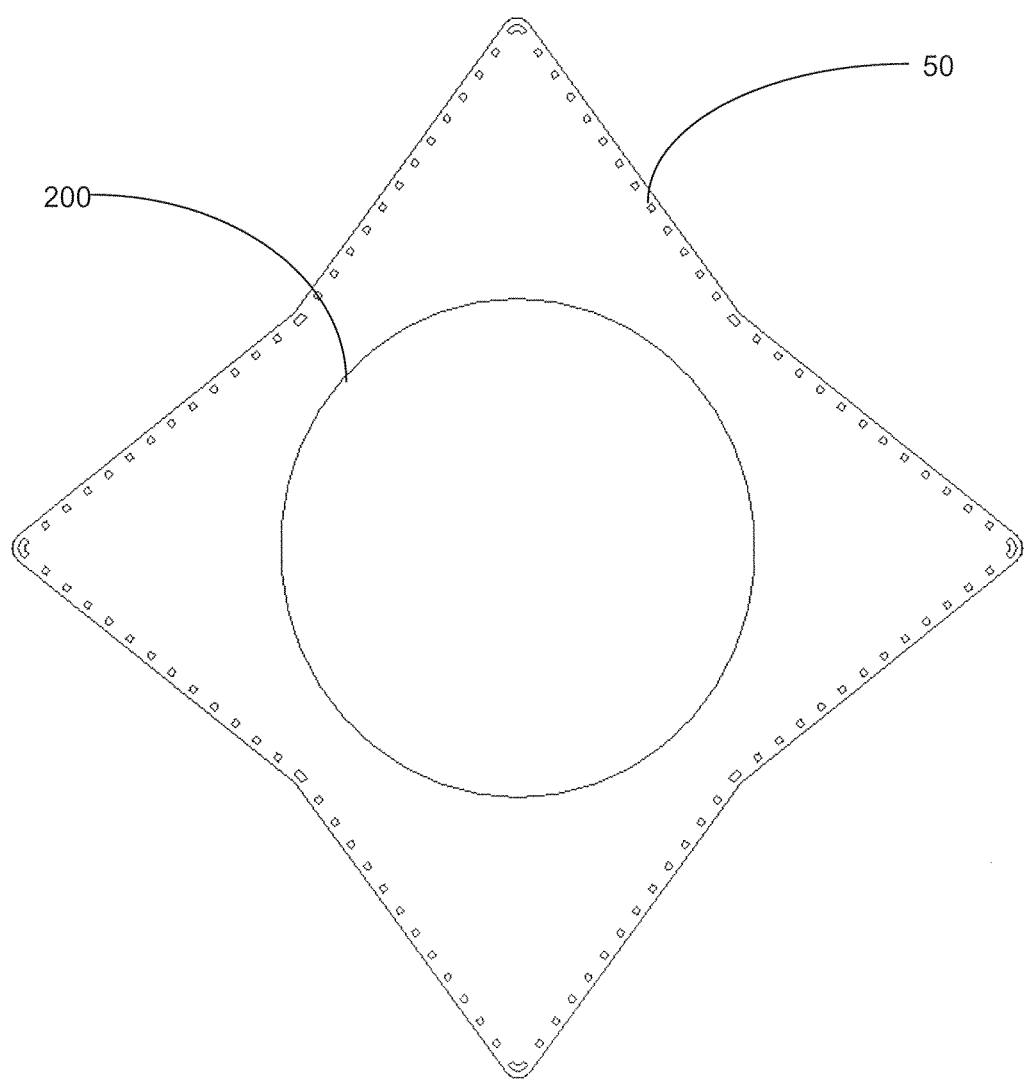
FIG. 12 illustrates a variation on the embodiment of FIG. 10.

FIG. 12 illustrates a practical embodiment which is similar to that of FIG. 6. Each of the corners 52 have edges which protrude radially inwardly from the straight line between the two corners 52. However, in FIG. 12 the edges each have two straight portions (and no curved portions). The straight portions converge to a point which is radially inwardly of the straight line between the two corners 52. Therefore the change in direction of the edge is abrupt (i.e. is at a point) compared to the embodiment of FIG. 11 where the change in direction is continuous. This shape may have a meniscus, especially at the point radially inward of the straight line, which is less stable than a meniscus pinned by a shape with a smoothly curved edge.

Figure 13A:
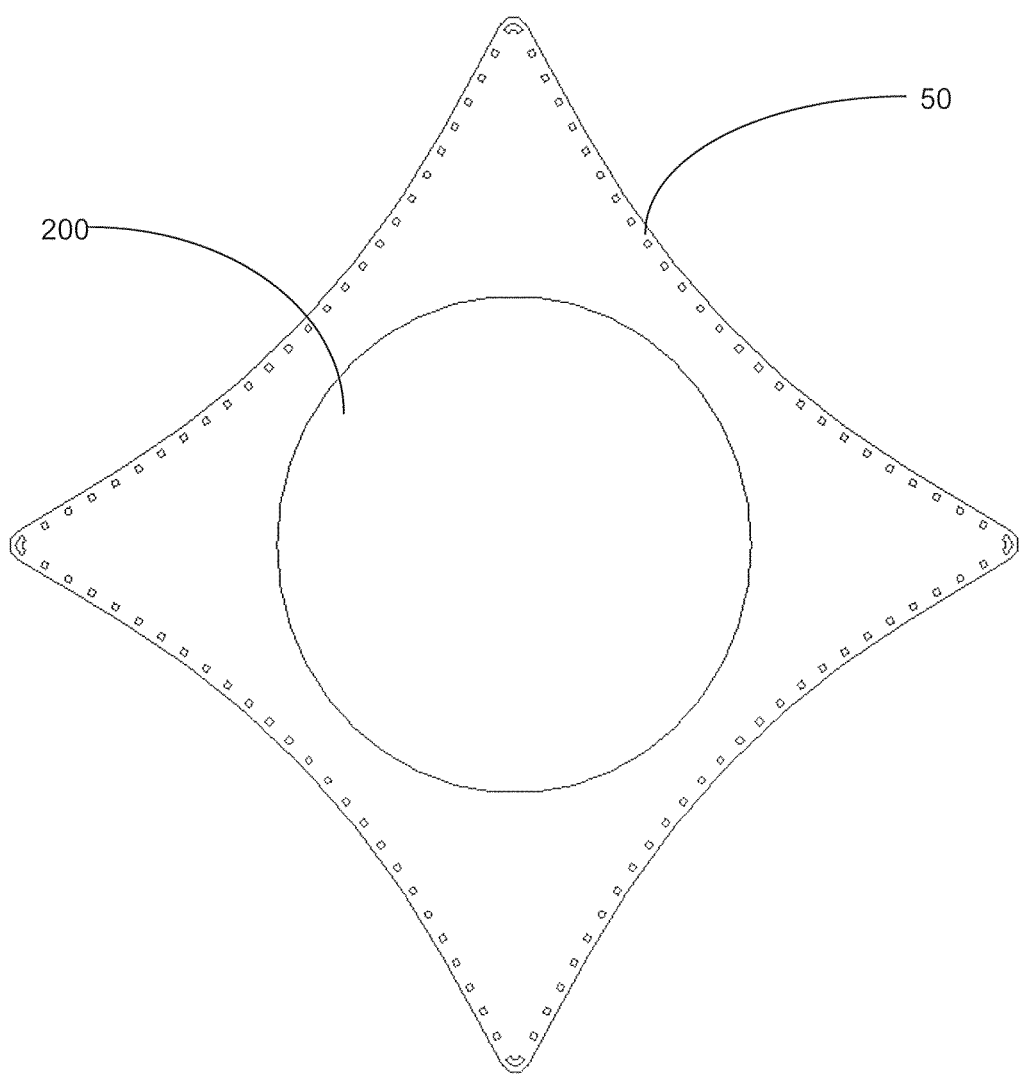
FIGS. 13a and 13b illustrate variations on the embodiment of FIGS. 11 and 12.
Figure 13B:
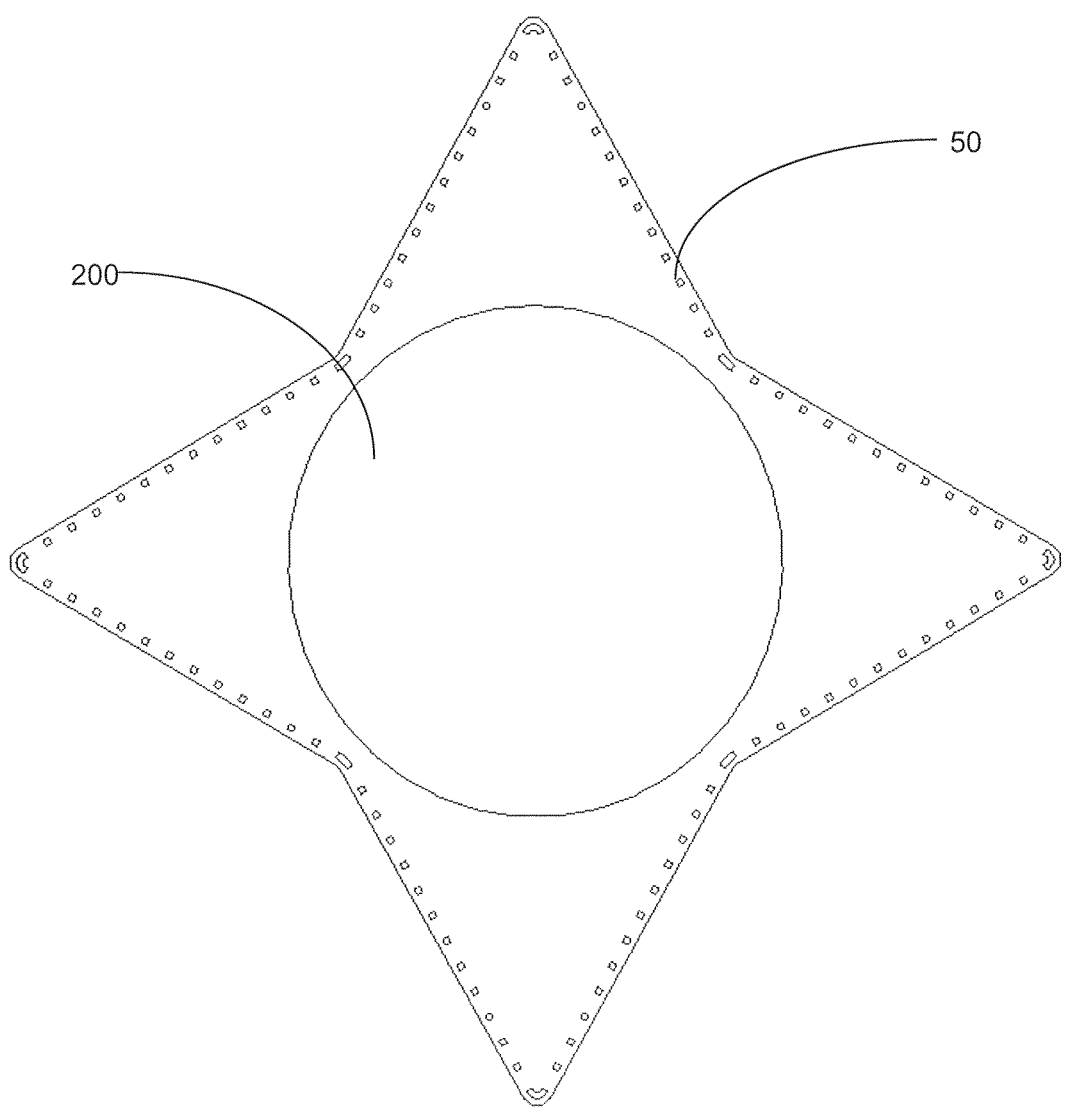

FIGS. 13a and 13b illustrate an embodiment similar to that of FIGS. 11 and 12 respectively except that the angle of each corner is 60° as opposed to 75° of FIGS. 11 and 12. This illustrates that it is possible for an embodiment of the present invention to have different angles at the corner. In an embodiment, the angle at the corner is selected from the range of 60° to 90°, or selected from the range of 75° to 90°, or selected from the range of 75° to 85°.

Figure 14:
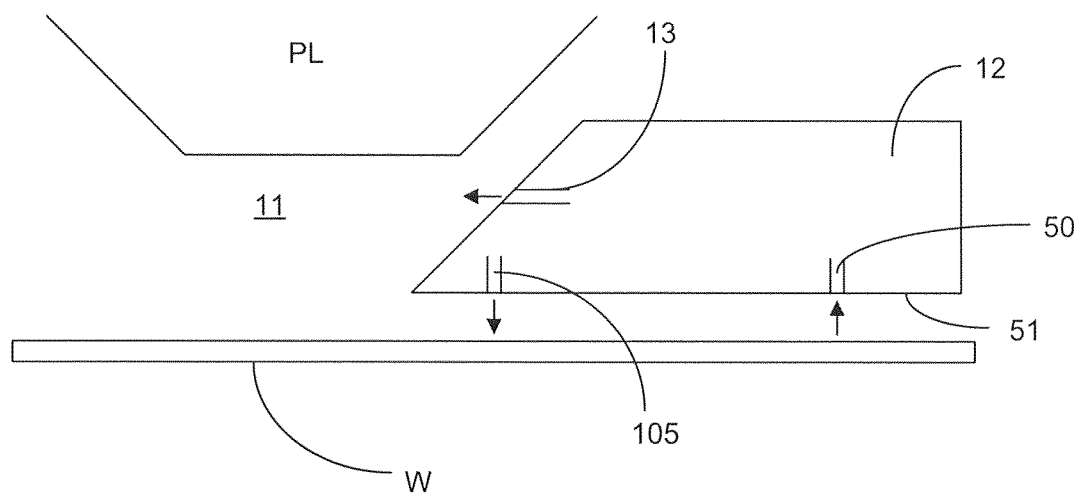
FIG. 14 is a schematic illustration, in cross-section, of a fluid handling structure according to an embodiment of the present invention.

FIG. 14 illustrates, in cross-section, part of a fluid handling structure of an embodiment of the present invention. The fluid handling structure forms a barrier 12 around the space 11 between the final element of the projection system PL and the substrate W. Liquid is provided to that space 11 mainly by inlet/outlet opening 13 as in the embodiment of FIG. 5. A series of openings 50 are formed in a bottom surface 51 of the barrier member 12 as described with reference to FIGS. 6-9 and 11-13. Formed in the bottom surface is one or more further openings 105 which is an outlet opening for providing fluid (e.g. liquid) out of the fluid handling structure. The further opening 105 may be considered an inlet to provide liquid into the space 11. The liquid out of opening 105 of the fluid handling system is directed towards the substrate W. This type of opening has been previously provided in order to reduce the chances of bubbles being generated in the immersion liquid because of gas trapped in a gap between the edge of the substrate W and the substrate table WT. However the geometry of the opening 105 has an impact upon the effectiveness of the fluid handling structure in containing liquid.

In particular, it is desirable that the fluid supply opening 105 has a shape, in plan which is similar to the shape of the openings 50, in plan. Indeed, the shapes of the opening 105 and openings 50 are desirably cornered, but may be any other shape, such as circular or oval. In an embodiment, each shape has, at the apex of each corner an opening 105 or opening 50. Desirably opening 105 is within 10 mm, desirably 5 mm of an opening 50. That is, all parts of the shape made by the openings 50 are within 10 mm of a part of the shape made by an opening 105, in an embodiment.

The opening 105 is radially inwardly of the openings 50, for example with respect to the optical axis of the projection system PS. The openings 50 may be regarded as being fluid extraction openings and the opening 105 can be regarded as a fluid supply opening.

An increase in scan speed is possible if a larger flow of liquid out of opening 105 is made. This is not desirable because of the risk of poorly thermally conditioned liquid finding its way into the space 11 between the projection system PS and the substrate W. That can lead to overlay errors. Instead, it is proposed to increase a density of openings 105 close to the corners and to reduce the density of openings 105 in the middle of the edges while maintaining the total flow of liquid through the openings 105. This helps to achieve the desired effect of maintaining a stable meniscus at a higher scan speed without increasing the total flow of liquid through the openings 105. Alternatively, this allows the flow through the openings to be decreased for a given maximum scan speed.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system or fluid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid handling structure for a lithographic apparatus, the fluid handling structure comprising a surface in which a plurality of fluid extraction openings are defined,
    wherein the fluid extraction openings:
    are directed towards a facing surface, when the facing surface is provided, the facing surface comprising a surface of a substrate and/or a substrate table configured to support a substrate,
    are configured to define a meniscus of an immersion liquid in an immersion space, when the immersion liquid in the immersion space is provided, the meniscus is defined by removing a mixture of (i) immersion liquid from the immersion space and (ii) gas from an atmosphere outside the immersion liquid, the meniscus defined between the facing surface and the surface in which the openings are defined, and
    each has an area less than or equal to 0.1 mm$^2$; and
    have a distance between geometric centers of neighboring fluid extraction openings selected from the range of 0.4 mm to 2 mm.

2. The fluid handling structure according to claim 1, wherein the area of each fluid extraction opening is selected from the range of 0.01 mm$^2$ to 0.1 mm$^2$.

3. The fluid handling structure according to claim 2, wherein the area of each fluid extraction opening is selected from the range of 0.04 mm$^2$ to 0.0625 mm$^2$.

4. The fluid handling structure according to claim 1, wherein a distance between geometric centers of neighboring fluid extraction openings is selected from range of 0.7 mm to 1 mm.

5. The fluid handling structure according to claim 1, wherein, in plan view, the plurality of fluid extraction openings are arranged so as to form a circle.

6. The fluid handling structure according to claim 1, wherein, in plan view, the plurality of fluid extraction openings are arranged so as to form a four-sided shape.

7. The fluid handling structure according to claim 1, further comprising inlet openings to supply the immersion liquid to the immersion space.

8. A fluid handling structure for a lithographic apparatus, the fluid handling structure comprising a surface in which a plurality of fluid extraction openings are defined, wherein the fluid extraction openings:
- are directed towards a facing surface, when the facing surface is provided, the facing surface comprising a surface of a substrate and/or a substrate table configured to support a substrate,
- are configured to define a meniscus of an immersion liquid in an immersion space, when the immersion liquid in the immersion space is provided, the meniscus is defined by removing a mixture of (i) immersion liquid from the immersion space and (ii) gas from an atmosphere outside the immersion liquid, the meniscus defined between the facing surface and the surface in which the openings are defined, and
- each has a maximum dimension less than or equal to 0.4 mm; and
- have a distance between geometric centers of neighboring fluid extraction openings greater than or equal to 0.4 mm.

9. The fluid handling structure according to claim 8, wherein the maximum dimension of each fluid extraction opening is selected from the range of 0.1 mm to 0.4 mm.

10. The fluid handling structure according to claim 8, wherein the area of each fluid extraction opening is selected from the range of 0.01 mm$^2$ to 0.1 mm$^2$.

11. A fluid handling structure for a lithographic apparatus, the fluid handling structure comprising a surface in which a plurality of fluid extraction openings are defined, wherein the fluid extraction openings:
- are directed towards a facing surface, when the facing surface is provided, the facing surface comprising a surface of a substrate and/or a substrate table configured to support a substrate,
- are configured to define a meniscus of an immersion liquid in an immersion space, when the immersion liquid in the immersion space is provided, the meniscus is defined by removing a mixture of (i) immersion liquid from the immersion space and (ii) gas from an atmosphere outside the immersion liquid, the meniscus defined between the facing surface and the surface in which the openings are defined, and
- have an area of fluid extraction openings provided per meter of a linear arrangement defined by the fluid extraction openings selected from the range of 25 mm$^2$m$^{-1}$ to 100 mm$^2$m$^{-1}$.

12. A fluid handling structure for a lithographic apparatus, the fluid handling structure comprising a surface in which a plurality of fluid extraction openings are defined, wherein the fluid extraction openings:
- are directed towards a facing surface, when the facing surface is provided, the facing surface comprising a surface of a substrate and/or a substrate table configured to support a substrate,
- are configured to define a meniscus of an immersion liquid in an immersion space, when the immersion liquid in the immersion space is provided, the meniscus is defined by removing a mixture of (i) immersion liquid from the immersion space and (ii) gas from an atmosphere outside the immersion liquid, the meniscus defined between the facing surface and the surface in which the openings are defined, and
- have an area of fluid extraction openings provided per meter of a linear arrangement defined by the fluid extraction openings selected from the range of 25 mm$^2$m$^{-1}$ to 100 mm$^2$m$^{-1}$.

13. The fluid handling structure according to claim 12, wherein the combined total area of all of the fluid extraction openings is selected from the range of 2 mm$^2$ to 20 mm$^2$.

14. The fluid handling structure according to claim 13, wherein the combined total area of all of the fluid extraction openings is selected from the range of 10 mm$^2$ to 18 mm$^2$.

15. The fluid handling structure according to claim 12, wherein a distance between geometric centers of neighboring fluid extraction openings is selected from the range of 0.4 mm to 2 mm.

16. An immersion lithographic apparatus comprising:
- a projection system having an optical axis;
- a substrate table configured to support a substrate, the substrate, substrate table, or both, defining a facing surface; and
- a fluid handling structure comprising a surface in which a plurality of fluid extraction openings are defined, the fluid handling structure configured to supply and confine immersion liquid to a space defined between the projection system and the facing surface, wherein the fluid extraction openings:
  - are directed towards the facing surface, when the facing surface is provided;
  - are configured to define a meniscus of an immersion liquid in the space, when the immersion liquid in the immersion space is provided, the meniscus is defined by removing a mixture of (i) immersion liquid from the immersion space and (ii) gas from an atmosphere outside the immersion liquid, the meniscus defined between the facing surface and the surface in which the openings are defined; and
  - have one or more of the following features:
    - the area of each fluid extraction opening is selected from the range of 0.01 mm$^2$ to 0.1 mm$^2$;
    - the maximum dimension of each fluid extraction opening is selected from the range of 0.1 mm to 0.4 mm;
    - the combined total area of all of the fluid extraction openings is less than or equal to 30 mm$^2$; or
    - the area of fluid extraction openings provided per meter of the edge meniscus that they define is selected from the range of 25 mm$^2$m$^{-1}$ to 100 mm$^2$m$^{-1}$.

17. The immersion lithographic apparatus according to claim 16, wherein the fluid extraction openings have the maximum dimension of each fluid extraction opening selected from the range of 0.1 mm to 0.4 mm.

18. A device manufacturing method comprising:
- providing an immersion liquid to an immersion space defined between a projection system and a substrate and/or a substrate table; and
- retrieving immersion liquid from the immersion space by applying an under pressure to a plurality of fluid extraction openings in a fluid handling structure, each of the fluid extraction openings having an area that is less than or equal to 0.1 mm$^2$, and a distance between geometric centers of neighboring fluid extraction openings is selected from the range of 0.4 mm to 2 mm.

19. A fluid handling structure for a lithographic apparatus, the fluid handling structure comprising a surface in which a plurality of fluid extraction openings are defined, wherein the fluid extraction openings:
- are directed towards a facing surface, when the facing surface is provided, the facing surface comprising a surface of a substrate and/or a substrate table configured to support a substrate,
- are configured to define a meniscus of an immersion liquid in an immersion space, when the immersion liquid in the immersion space is provided, the meniscus is defined by removing a mixture of (i) immersion liquid from the immersion space and (ii) a gas from an atmosphere outside the immersion liquid, the meniscus defined between the facing surface and the surface in which the openings are defined, each has an area less than or equal to 0.1 mm$^2$, and have a combined total area of less than or equal to 30 mm$^2$.

20. The fluid handling structure according to claim 19, wherein the area of each fluid extraction opening is selected from the range of 0.04 mm$^2$ to 0.0625 mm$^2$.

* * * * *